United States Patent [19]

Curtice

[11] 4,000,415
[45] Dec. 28, 1976

[54] TRANSFERRED ELECTRON DEVICE PULSE TRAIN GENERATOR
[75] Inventor: Walter Richard Curtice, Princeton Junction, N.J.
[73] Assignee: RCA Corporation, New York, N.Y.
[22] Filed: Feb. 9, 1976
[21] Appl. No.: 656,286
[52] U.S. Cl. .................. 307/260; 307/299 R; 328/59; 331/107 G
[51] Int. Cl.² ............. H03K 5/01; H03K 3/64
[58] Field of Search ....... 307/299 R, 260; 328/59, 328/129; 324/186; 331/107 G

[56] References Cited
UNITED STATES PATENTS

| | | | |
|---|---|---|---|
| 3,296,525 | 1/1967 | Sakuma | 324/186 |
| 3,582,678 | 6/1971 | Davis, Jr. et al. | 328/129 |
| 3,801,917 | 4/1974 | Weinstein | 328/129 |
| 3,805,125 | 4/1974 | Sterzer | 307/299 R |
| 3,848,141 | 11/1974 | Sterzer | 307/299 R |

Primary Examiner—Stanley D. Miller, Jr.
Attorney, Agent, or Firm—E. J. Norton; J. D. Lazar; M. A. Lechter

[57] ABSTRACT

A controlled interval pulse train generator comprising a plurality of three terminal transferred electron logic devices, and a delay line. The generator produces a train of small pulse-width voltage pulses at intervals determined by the delay line. The pulse train is started in response to an initial pulse and is terminated in response to a voltage step.

4 Claims, 1 Drawing Figure

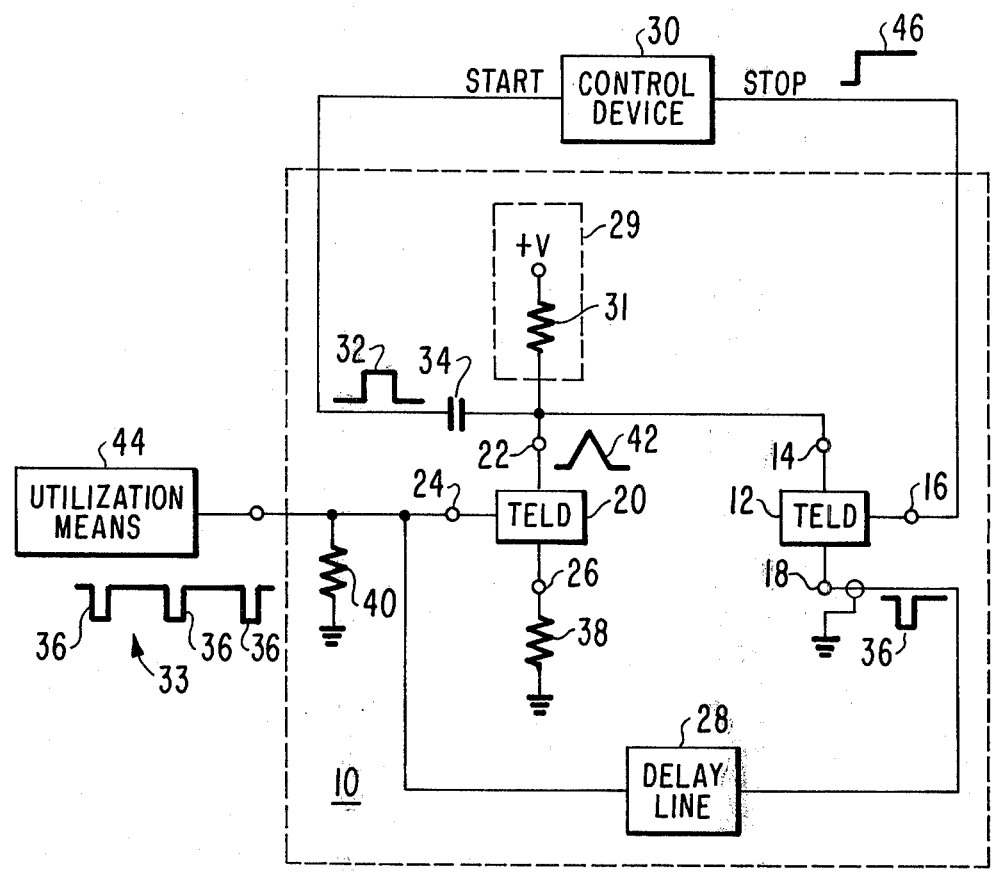

$4,000,415$

TRANSFERRED ELECTRON DEVICE PULSE TRAIN GENERATOR

The Government has rights in this invention pursuant to Contract No. N00039-75-C-0225 awarded by the Department of the Navy.

BACKGROUND OF THE INVENTION

1. Field of the Invention

The present invention relates to clock pulse generators and in particular to high accuracy startable pulse train generators.

2. Description of the Prior Art

Precise interval measurements are essential in nuclear and ballistic time-of-flight tests, radar ranging and in the characterization of active components, such as integrated circuits. In making such interval measurements, utilization of a pulse train, startable and stopable on command, of short duration pulses with accurately controlled interpulse spacing is desirable for use with digital signal processing equipment. For a detailed discussion of time interval measurements, reference is made to "Measure time interval precisely," by David Martin, Electronic Design, 24 Nov. 22, 1974, pp. 162 et seq.

Three terminal transferred electron devices, hereinafter termed Transferred Electron Logic Devices (TELD), having an anode, cathode and gate terminals, are well known. Such devices are more commonly known as Schottky-Barrier-Gate Gunn-Effect Digital-Devices. The general operation of a TELD may be described as follows.

Upon a voltage difference between the anode and gate terminals exceeding a predetermined threshold value a mobile "dipole" domain is created in the TELD. A dipole domain comprises an electron charge depletion region preceding an electron charge accumulation region. The dipole domain travels from the cathode to the anode of the device, causing a drop in the current through the device during the transit period. Thus, in response to the voltage difference between the anode and gate exceeding the threshold value, the TELD, in cooperation with an impedance loading the cathode, generates a negative polarity voltage pulse having pulsewidth determined primarily by the geometry of the device. The above-mentioned anode-gate difference voltage threshold value is determined by the anode and gate bias voltages with respect to the cathode, and the TELD geometry and material parameters. For a more detailed description of TELD's reference is made to "Threshold Condition of Schottky Gate-Gunn Pulse Device" Y. Utsugi et al., Review of the Electrical Communication Laboratories, Vol. 23, Nos. 3–4, March-April 1975, p. 279 et seq.

TELD's have been utilized as high speed pulse repeaters, that is, pulse train generators. For a discussion of prior art high speed pulse repeaters, reference is made to "Characteristics and Applications of a Schottky-Barrier Gate Gunn-Effect Digital-Device" by Sugeta et al., IEEE Transactions on Electron Devices, Vol. ED-21, No. 8, Aug. 1974, pp. 504 et seq. Such prior art pulse repeaters operate with pulsed, as opposed to D.C., biasing. Pulse biased repeaters are not suitable for time interval measurement since inherent time delays in the pulse bias supply introduce large errors into time measurements. Moreover, such prior art pulse train generators require a TELD having both short pulse generation capability and an extremely sensitive gate triggering characteristic. By "sensitive gate triggering characteristic" it is meant that the TELD must trigger into operation in response to a low magnitude gate-pulse. TELD's having both the above-mentioned characteristics are very difficult to construct in accordance with present technology.

SUMMARY OF THE INVENTION

The present invention is directed to a pulse train generator comprising first means, having first, second and third terminals, for generating an output pulse at the third terminal in response to a predetermined difference in voltage between the first and second terminals. The predetermined difference voltage is determined by the voltage at the third terminal. Second means, responsive to the first means output pulse, delays the pulse by a predetermined time period. Third means generates an output voltage pulse in response to the delayed pulse. The third means output pulse is applied to the first terminal of the first means to cause thereby generation of another first means output pulse. Fourth means selectively applies an initial pulse to the first means and subsequently a voltage step to the first means. The first means generates thereby a train of pulses in response to the initial pulse and subsequent third means pulses, the period between the respective pulses in the pulse train being substantially determined by the second means delay, until the pulse train is terminated by application of the voltage step to the first means second terminal.

BRIEF DESCRIPTION OF THE DRAWING

The sole FIGURE of the drawing is a schematic diagram of a pulse train generator in accordance with the present invention.

DETAILED DESCRIPTION OF THE PREFERRED EMBODIMENT

Referring to the drawing, a pulse train generator 10 in accordance with the present invention comprises: a Transferred Electron Logic Device (TELD) 12 having anode 14, gate 16 and cathode 18; a second TELD 20 having anode 22, gate 24, and cathode 26; and a suitable delay 28, such as a low-loss RF transmission line. Anodes 14 and 22 are respectively connected to a bias voltage source 29, which includes a resistor 31 and biases anodes 14 and 22 of TELD's 12 and 20 to just below threshold value with respect to their respective gate voltages. A suitable control device 30, such as a short pulse generator, generates upon command, for example, at the beginning of a time period to be measured, a positive voltage pulse 32 to initiate the generation of a pulse train 33 by generator 10. Pulse 32 is applied, through a DC blocking capacitor 34 to anode 14 of first TELD 12. The application of pulse 32 to anode 14 causes the voltage of anode 14 of TELD 12 to increase, bringing the anode-gate (14–16) voltage difference above threshold value, anode-triggering thereby TELD 12. The value of the current through TELD 12 drops during the period in which a dipole domain travels from cathode 18 to anode 14, whereby a negative voltage pulse 36 is developed between cathode 18 and ground.

Similarly, TELD 20 may also be anode-triggered by pulse 32. However, cathode 26 is connected, through a resistor 38, to ground, and the negative pulse generated by anode-triggering TELD 20 is thus passed to ground without use in generator 10.

Pulse 36 from TELD 12 is applied through delay line 28 to gate 24 of TELD 20. A resistor 40, having a value equal to the characteristic impedance of delay 28, is connected between gate 24 and ground. Resistor 40 terminates delay 28 in its characteristic impedance, ensuring thereby that no pulse reflections will occur at gate 24 and that no pulses will be passed from gate 24 back to cathode 18 of TELD 12. Pulse 36, as delayed by delay line 28, lowers the instantaneous voltage at gate 24, causing the anode-gate (22–24) voltage difference of TELD 20 to increase above threshold, and thereby gate-triggering a dipole domain in TELD 20 in a manner similar to that described for TELD 12.

The current in TELD 20 drops as the dipole domain travels from cathode 26 to anode 22, resulting in a positive voltage pulse 42 being generated at anode 22 having a pulsewidth determined by the impedance load on anode 22. Pulse 42 is applied to anode 14 of TELD 12, causing the above-described pulse 36 generation to reoccur which, in turn, causes generation of another pulse 42, which initiates generation of a further pulse 36, in a cyclic manner. Thus, a plurality of pulses 36 are generated in response to the initial pulse 32 and the subsequent pulses 42 to form pulse train 33. Pulse train 33 is applied to suitable utilization means 44, such as a counter.

The fringe capacitance between anode 22 and ground, in shunt with the net resistive loading between anode 22 and ground, produces a network (RC) time constant that is typically slower than TELD 20's inherent response time, such time constant tending to increase the rise and fall time of pulse 42. However, the fringe capacitance at cathode 18 is much less than the capacitance at anode 22. Hence, the time constant at cathode 18 is much lower than the time constant at anode 22, and the pulse width of negative pulse 36 as generated at cathode 18 is determined primarily by the dipole domain travel time, of device 12. The width of pulse 36 is thus independent of the pulse width of the triggering anode pulse. It should be noted, however, that during periods where the anode (14) voltage is held at triggering levels, successive dipole domains are produced in TELD 12, and one pulse 36 is generated for each completed dipole domain transit from cathode 18 to anode 14. Thus the duration of pulse 42 should be less than twice the dipole domain travel time.

The magnitude of voltage at anode 14 of TELD 12 required for the generation of a dipole domain, is determined by the respective voltages at gate 16 and cathode 18 of TELD 12. TELD 12 is inhibited by increasing the voltage at gate 16 by an amount equal to or greater than the amplitude of pulses 42. Accordingly, control device 30, upon command, for example, at the end of the time period to be measured, generates a relatively high magnitude voltage step 46 to terminate pulse train 33.

It should be noted, that the net AC load resistance on anode 22 of TELD 20 must be positive or instability will occur. However, since the current through TELD 12 decreases as the voltage of anode 14 with respect to ground increases, TELD 12 presents a negative-resistance type load to anode 22 during generation of pulses 42. Biasing source resistor 31, in parallel with TELD 12, should be chosen of low enough value to compensate for the loading effects of TELD 12.

It should also be noted that the magnitude of negative voltage pulse 36 must be sufficient to gate-trigger TELD 20. The magnitude of pulse 36 is equal to the change in current in TELD 12 due to the dipole domain times the characteristic impedance of delay line 28. The respective amplitudes of initial pulse 32 and anode pulses 42 similarly must be sufficient to cause anode triggering of TELD 12. TELD 20 provides the gain of generator 10 to overcome losses in generator 10 and provides thereby for use of a TELD 12 having less sensitive gate-triggering characteristics than the TELD's required in prior art generators.

Time interval measurement, using pulse generator 10 may be effected as follows. At the beginning of the time interval, for example, upon transmission of a radar probe pulse, control device 30 generates initial pulse 32 initiating pulse train 33. The first pulse 36 of pulse train 33 occurs a short fixed time interval after the occurrence of pulse 32, such time interval being essentially established by delay line 28. Thus, pulse train 33 is synchronized with the interval to be measured and accordingly, alleviates one source of error inherent in free-running pulse train generators as described in the aforementioned reference "Measure time interval precisely." The pulse width of the individual pulses 36 in pulse train 33 are extremely short, in the vicinity of 100 picoseconds, and the spacing between pulses 36 in pulse train 33 are determined primarily by delay line 28. It should be appreciated that, since delay line 28 is typically a passive component, the inter-pulse spacing of pulse train 33 is extremely stable.

Pulse train 33 continues until control device 30 generates voltage step 46, signifying the end of the time interval, for example, upon reception of a skin reflection of the above-mentioned exemplary radar probe signal. Voltage step 46 inhibits TELD 12 to terminate pulse train 33. It should be noted that pulse train 33 may be terminated asynchronously, that is, voltage step 46 may not occur simultaneously with a pulse 42, thereby making termination asynchronous with respect to the pulse 36 generation cycle. In such an instance, the cycle during which voltage step 46 occurs continues to completion. Thus, if voltage step 46 occurs between $n$ and $n+1$ cycles after pulse 32, then $n+1$ output pulses 36 are produced.

Utilization means 44, counts the number of pulses 36 generated during the time interval, and, since the inter-pulse period is known and stable, computes the time interval.

A pulse train generator 10 in accordance with the present invention may be constructed utilizing for TELD's 12 and 20 GaAs TELD's having 9$\mu$m anode-gate spacing, with $n \times l \geq 10^{13}/cm^2$ and $n \times d \geq 10^{12}/cm^2$, where $n$ is the donor density in the epitaxial layer, $l$ is the cathode-anode separation and d is the epitaxial layer thickness. A choice of $n = 3 \times 10^{16}/cm^3$, $l = 12\mu m$ and $d = 1\mu m$ should produce 25 to 40 percent current drops in GaAs devices with low defect density, low trap density and large low field electron mobility. A device width of 100$\mu$m is suitable. A one nanosecond (ns), 100$\Omega$ microstrip delay line is suitably used for delay line 28; a 100$\Omega$ resistor for resistor 30; a 50 pF capacitor for capacitor 34; an essentially zero ohm resistance for resistor 38, achieved by cathode 26 being connected directly to ground; and a 100$\Omega$ resistor for resistor 40. In a generator 10 using such components, a 15v bias supply generates 100ma total bias current to TELD's 12 and 20. Initial pulse 32 is typically of 2v amplitude and between 100 and 200 pS in width. TELD 12 generates a 10ma drop in current resulting in a pulse 36 of −1v amplitude and approximately 100 pS in duration. TELD 20 generates a 20ma current drop, resulting in a pulse 42 of 2v amplitude. The fringe capacitance at anode 22 is found to be in the vicinity of 0.3pF. Voltage step 46 is typically at least of 2v amplitude.

It should be appreciated that operation of generator 10 may be initiated by application of a negative polarity pulse to gate 16 or cathode 18 of TELD 12 as opposed to positive pulse 32 being applied to anode 14 (and anode 22).

It should further be appreciated that a three-terminal device, such as a fieldeffect transistor, having a fast response and high degree of current control by the gate electrode may be used in place of TELD 20.

What is claimed is:

1. A circuit for generating a train of pulses comprising:
    first means, comprising a transferred electron device having first, second and third terminals, for generating an output pulse at said third terminal in response to a difference in voltage between said first and second terminals greater than a threshold voltage difference, said threshold difference being determined by the voltage at said third terminal;
    second means, responsive to said first means output pulse, for providing an output pulse delayed by a predetermined time period with respect to said first means output pulse;
    third means, responsive to said delayed pulse, for generating an output pulse in response to said delayed pulse, said third means output pulse being applied to said first means first terminal to effect thereby generation of another first means output pulse; and
    fourth means, for providing a start signal to selectively effect an initial temporary voltage difference between said first means first and second terminals greater than said threshold difference and subsequently providing a stop signal to said first means second terminal to inhibit said first means;
    said first means generating a train of pulses in response to said initial voltage difference and subsequent third means output pulses, the period between respective pulses in said pulse train being substantially equal to said predetermined time period, said pulse train terminating in response to said stop signal.

2. The circuit of claim 1, wherein said first means first, second and third terminals respectively comprise an anode, a gate, and a cathode.

3. The circuit of claim 2 wherein said third means comprises a second three-terminal device, having an anode, a cathode and a gate, said second device gate being receptive of said delayed pulses, said second device cathode being coupled to a ground and said second device anode being coupled to said first means anode.

4. The circuit of claim 2, wherein said first means, when uninhibited, generates said output pulse in response to each positive input pulse having a magnitude above a first predetermined value applied to said first terminal and is inhibited by a positive voltage step signal having a magnitude at least equal to said first predetermined value applied to said second terminal.

* * * * *